Jan. 21, 1969 G. H. HEILMEIER ET AL 3,423,654

BISTABLE FERROELECTRIC FIELD EFFECT DEVICE

Filed May 2, 1967

INVENTORS

GEORGE H. HEILMEIER &

PHILIP M. HEYMAN

BY W. S. Hill

AGENT

United States Patent Office 3,423,654

Patented Jan. 21, 1969

3,423,654
BISTABLE FERROELECTRIC FIELD EFFECT DEVICE

George H. Heilmeier, Philadelphia, Pa., and Philip M. Heyman, Cranbury, N.J., assignors to Radio Corporation of America, a corporation of Delaware Filed May 2, 1967, Ser. No. 635,466
U.S. Cl. 317—235 4 Claims
Int. Cl. H01l 11/00; 15/00

ABSTRACT OF THE DISCLOSURE

Field effect transistor of the type having an insulated ferroelectric gate wherein the gate electrode is directly connected to the drain electrode.

*Background of the invention*

A prior art field effect transistor having an insulated gate comprises a semiconductor body having a conductive channel between a surface of the body and a P–N junction in the body. Two spaced nonrectifying contacts are connected to the channel and define the ends of a drain current path through the channel. A ferroelectric insulating body is positioned adjacent to the channel and a gate electrode is spaced from the channel by the ferroelectric body. A device of this type may be used as a circuit element in signal-translating, switching, or information-storing apparatus.

As a switch the device has two stable states of operation, one in which the current conducting path through the device is in a state of relatively high impedance, and another in which the path is in a state of relatively low impedance. The conductance in each state is independent of the polarity across the conductive path. These states of operation have memory. That is, they can be conditioned by application of a signal to a control element, the ferroelectric, which establishes that state and then maintains it even after the signal has been removed or reduced. This mode of control utilizes the well-known electrostatic hysteresis characteristics of ferroelectric material whereby the application of an electrostatic field across the ferroelectric body establishes a charged state within the body, at least a portion of which remains after the field has been removed or until the field is reversed to a sufficient degree.

The above-described prior art device has certain disadvantages. Because the semiconductor and ferroelectric bodies are separate and merely placed adjacent one another, discontinuities occur therebetween, resulting in a lowered efficiency, and less chemical and electrical stability in the device.

Another disadvantage of the prior art structure is that the channel is defined in part by a P–N junction which isolates the channel from the bulk of the semiconductor body. The P–N junction and the bulk of the semiconductor body outside the channel do not play an active part in the operation of the device, although they present problems in fabricating the device and also introduce parasitic inductances and capacitances into the device operation.

An improved field effect transistor which includes an insulated ferroelectric gate is described in U.S. patent application Ser. No. 406,315, filed Oct. 26, 1964, of Harrison et al. This improved device comprises a body of ferroelectric insulating material having two opposed major surfaces. The body acts as the supporting substrate for the entire device. On one of the major surfaces there is deposited a layer of bandgap material which may be either a semiconductor or an insulator. Spaced source and drain contacts are connected to the layer. On the other major surface of the ferroelectric body is a metallic gate electrode. Both the layer of bandgap material and the gate electrode comprise thin films of material deposited on the ferroelectric body, as by evaporation, such that no noticeable discontinuities are formed between the ferroelectric body and the deposited layers of material. There is no P–N junction in the device. The device structure provides substantial improvements in efficiency and stability.

*Summary of the invention*

The present invention is a variation of the Harrison et al. device. In the present invention the gate electrode of the device is directly connected to the drain, thus providing, in effect, a two-terminal device in which the drain-source and gate-source voltages are identical. Thus, the present device is more adaptable as a switching element. The present device, like previous devices of this type, may be switched from the on state to the off state and the power may be cut off with the device remaining in the off state. In fact, no power is required to retain the device in either its on state or its off state once it has been switched from one to the other.

*Drawings*

*Description of preferred embodiment*

Figure 1:
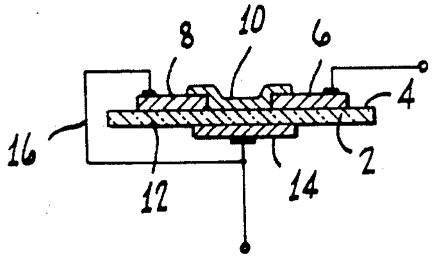
FIGURE 1 is a sectional view of an embodiment of the device of the present invention.

As shown in FIGURE 1, a preferred embodiment of the device comprises a thin plate 2 of a ferroelectric material having a thickness of 0.6 mm., which functions as a support for the other parts of the device. On one major surface 4 of the ferroelectric plate 2 are a source electrode 6 and a drain electrode 8 spaced apart a distance of 0.03 mm. These electrodes may have a thickness of 300 to 500 A. In the spacing between the source and drain electrodes and overlapping the electrodes is a thin film of a semiconductor 10. On the opposite major surface 12 of the ferroelectric body 2 is a gate electrode 14 with its central axis corresponding to the central axis of the spacing between the source and drain electrodes. This electrode may have a thickness about the same as the thicknesses of the source and drain electrodes.

In the present embodiment, the semiconductor is N-type and has a thickness of 50 to 100 A. and a resistivity of 0.01 to 1 ohm-cm.

The device also includes an electrical connection 16 between the drain electrode and the gate electrode.

Figure 2:
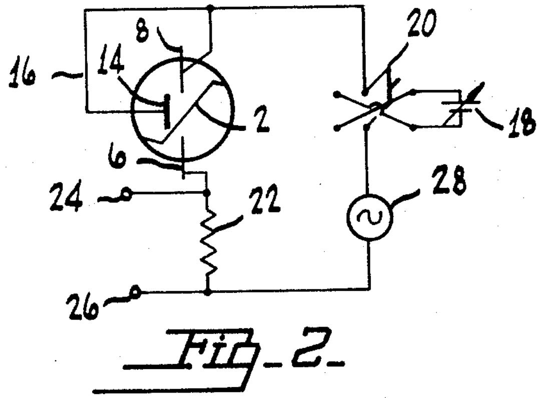
FIGURE 2 is a schematic diagram of a typical circuit in which a device of the invention may be utilized.

The device may be operated in a typical circuit as illustrated in FIGURE 2. The circuit includes a source of potential, such as a battery 18, which is connected between the source and drain electrodes 6 and 8, such that it may be poled in either direction by means of a reversing switch 20. A load resistor 22 is also included in the source and drain circuit, as well as a source of signal voltage 28. Output electrodes 24 and 26 are connected across the ends of the load resistor 22.

Figure 3:
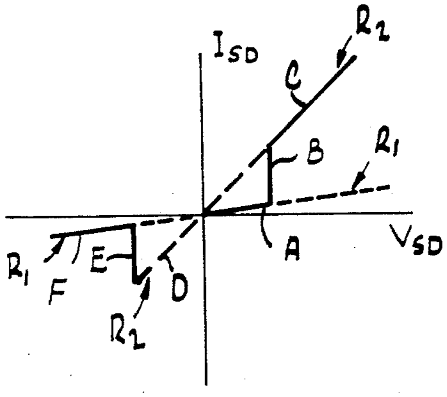
FIGURE 3 is a plot of source-drain voltage against source-drain current which illustrates how the device may be switched between a low impedance and a high impedance state.

FIGURE 3 is a plot of source-drain voltage against source-drain current illustrating how the device may be switched between a high impedance state and a low impedance state. With no source-drain voltage applied across the source and drain electrodes of the semiconductor layer, no current will be flowing through the semiconductor. If the battery 18 is connected into the circuit so that the drain electrode 8 is negative and the source electrode 6 is positive the device will remain in its high impedance state, which may also be referred to as its "off" state. This is because with this polarity the ferroelectric body will be polarized so that a negative charge exists close to the surface of the body at the interface between the ferroelectric body and the semiconductor layer. This negative charge induces a positive charge in the semiconductor layer adjacent the interface with the ferroelectric body and, since the semiconductor is N-type, there will be substantially no charge carriers to conduct current between the source and drain electrodes. Thus, the impedance through the semiconductor layer between the source and drain is relatively high.

If it is desired to switch the device to its low impedance state or "on" state, it is first necessary to reverse the polarity of the battery in the circuit so that the drain electrode 8 is positive and the source electrode 6 is negative. Since the gate electrode 14 is at the same potential as the drain electrode, the gate electrode becomes positive and the ferroelectric body 2 becomes polarized so that a positive charge exists adjacent the interface between the ferroelectric body and the semiconductor body. This induces a negative charge in the semiconductor body and the semiconductor body then readily conducts current.

As shown in the plot of FIGURE 3, however, this state is not reached immediately. At first (part A of the graph), as the source-to-drain voltage is increased with the drain positive, the ferroelectric body does not switch its polarization. As a consequence the semiconductor layer 10 remains at a high level of impedance $R_1$. But when a critical voltage is reached, abruptly the ferroelectric becomes polarized positively and then a sudden increase in conductivity of the semiconductor layer 10 occurs (part B of the graph) since the semiconductor has been switched to a lower impedance level $R_2$.

After the switching voltage has been exceeded and the low impedance level $R_2$ has been achieved, further increase in source-drain voltage causes an increase in source-drain current in a linear manner (part C of the graph). However, there is no further increase in polarization of the ferroelectric.

In order to switch the device back to its off, or high, impedance state, it is necessary to decrease the source-drain voltage. As the voltage decreases, the source-drain current falls in a linear manner and becomes zero when the source-drain voltage is zero. The source-drain voltage is now reversed in polarity so that the drain becomes more negative than the source (part D of the graph), and when the source-drain voltage reaches switching voltage level, the ferroelectric suddenly switches back to its original polarization and the current decreases to practically zero (part E of the graph). Resistance of the semiconductor rises again to its original high level $R_1$. As source-drain voltage is further increased in this direction, current through the semiconductor rises slowly in a linear manner (part F of the graph).

From this point, the cycle can be repeated and the device can be switched between its "on" state and its "off" state as often as desired. Also, when in either its high impedance ("off") state or its low impedance ("on") state, the current may be cut off and the device will remain in the state it had until current is turned on again. Thus, the device can be used as a memory storage element with no current needed to maintain it in either of its two conditions. The element can be "read" continuously and nondestructively by a small sensing signal in the source-drain circuit.

Another use for the device is a means to set a volume control at either a high or a low level by remote control. An audio frequency sinusoidal voltage signal may be sent out by signal source 28 and, depending on which way the battery 18 is connected into the circuit, the result will be either to cause a high or low level of current to appear at output electrodes 24 and 26. For example, when the semiconductor is N-type and when the battery is poled to produce a negative charge on the gate electrode, a low level of current appears.

The device can be fabricated as follows: The ferroelectric body may comprise a single crystal plate of triglycine sulfate. Other ferroelectrics, such as barium titanate, or certain types of "PZT" (lead zirconate titanate) may also be used. Source, drain and gate electrodes may comprise evaporated gold having a thickness of about 300 A. A preferred semiconductor is tellurium which can be evaporated at relatively low temperatures and deposited on an unheated substrate. The tellurium may have a resistivity of 0.01 to 1 ohm-cm., for example. The tellurium can be deposited in a vacuum chamber, with the substrate at room temperature, using a vacuum of $10^{-5}$ or $10^{-6}$ mm. of mercury. It may be put down at about a 10–15 A./sec. rate. Thickness of the tellurium film may, for example, be up to 100 A. but it is preferred to keep the thickness below 50 A. as measured by a quartz crystal thickness monitor. It is preferrable to clean the surface of the ferroelectric prior to depositing the electrodes and the semiconductor. This may be done by subjecting the ferroelectric body to a glow discharge above its Curie temperature just prior to the depositions. The purpose of the glow discharge above the Curie temperature is to prevent the surface of the ferroelectric from picking up compensating charges due to electrostatic attraction. The ferroelectric body is also provided with a highly polished surface prior to depositing the tellurium.

What is claimed is:

1. A field effect transistor comprising a layer of bandgap material, spaced source and drain electrodes connected to said layer, a gate electrode spaced from said layer by a ferroelectric insulator body, and means electrically connecting said drain electrode and said gate electrode.

2. A transistor according to claim 1 in which said layer of bandgap material is a film of semiconducting material disposed on and supported by said ferroelectric insulator body.

3. A transistor according to claim 1 in which said ferroelectric insulator body is a thin plate of single crystal material having two opposed surfaces, said layer of bandgap material is a film supported on one of said surfaces, said source and drain electrodes are closely spaced metal films also supported on said one surface and overlapped by said layer of bandgap material, and said gate electrode is a metal film supported on the other one of said opposed surfaces.

4. A transistor according to claim 3 in which said ferroelectric insulator body is composed of triglycine sulfate and said bandgap material is tellurium.

References Cited

UNITED STATES PATENTS 2,773,250 12/1956 Aigrain et al. ------- 317—235

JOHN W. HUCKERT, *Primary Examiner.*

JERRY D. CRAIG, *Assistant Examiner.*

U.S. Cl. X.R.

307—251, 304